(12) United States Patent
Aeloiza et al.

(10) Patent No.: US 10,393,795 B2
(45) Date of Patent: Aug. 27, 2019

(54) SEMICONDUCTOR FAILURE PROGNOSTICATION

(71) Applicant: ABB Schweiz AG, Baden (CH)

(72) Inventors: Eddy Aeloiza, Apex, NC (US); Arun Kadavelugu, Raleigh, NC (US); Joonas Puukko, Helsinki (FI); Liming Liu, Cary, NC (US); Jukka-Pekka Sjoroos, Espoo (FI)

(73) Assignee: ABB Schweiz AG, Baden (CH)

( * ) Notice: Subject to any disclaimer, the term of this patent is extended or adjusted under 35 U.S.C. 154(b) by 259 days.

(21) Appl. No.: 15/659,096

(22) Filed: Jul. 25, 2017

(65) Prior Publication Data

US 2019/0033362 A1 Jan. 31, 2019

(51) Int. Cl.
*G01R 31/26* (2014.01)
*H01L 29/16* (2006.01)
(Continued)

(52) U.S. Cl.
CPC ..... *G01R 31/2621* (2013.01); *G01R 31/2642* (2013.01); *G01R 31/2817* (2013.01);
(Continued)

(58) Field of Classification Search
CPC ............ G01R 31/2621; G01R 31/2642; G01R 31/2817; H01L 29/1608; H01L 29/7805; H03K 17/687
(Continued)

(56) References Cited

U.S. PATENT DOCUMENTS 6,405,154 B1 6/2002 Ryan
8,823,411 B2 9/2014 League
(Continued)

FOREIGN PATENT DOCUMENTS

DE 102014100122 B3 * 4/2015 ......... G01R 31/2628
JP 3080043 B2 8/2000
JP 2016052197 A 4/2016

OTHER PUBLICATIONS

Lemmer; Translation of DE 102014100122 B2 "Ermittlung der Sperrschichttemperatur eines Fet durch die Bodydiode"; Apr. 16, 2015; EPO & Google (Year: 2015).*
(Continued)

*Primary Examiner* — Melissa J Koval
*Assistant Examiner* — Rahul Maini
(74) *Attorney, Agent, or Firm* — Taft Stettinius & Hollister LLP; J. Bruce Schelkopf

(57) ABSTRACT

Unique systems, methods, techniques and apparatuses of semiconductor failure prognostication. One exemplary embodiment is a power converter comprising a semiconductor switch and a converter control system. The converter control system is configured to turn on the semiconductor switch, measure a first voltage and a current during reverse conduction, estimate junction temperature of the semiconductor device, turn off the semiconductor device, measure a second voltage after turning off the semiconductor device, determine a resistance value using the second voltage measurement, determine an expected resistance value, predict a failure of the semiconductor device using the resistance value and the expected resistance value, and transmit a semiconductor device failure warning.

20 Claims, 3 Drawing Sheets

(51) Int. Cl.
*H01L 29/78* (2006.01)
*H03K 17/687* (2006.01)
*G01R 31/28* (2006.01)

(52) U.S. Cl.
CPC ...... *H01L 29/1608* (2013.01); *H01L 29/7805* (2013.01); *H03K 17/687* (2013.01)

(58) Field of Classification Search
USPC .................................................. 324/762.09
See application file for complete search history.

(56) References Cited

U.S. PATENT DOCUMENTS

| | | |
|---|---|---|
| 8,957,723 B2 | 2/2015 | Zoels et al. |
| 2013/0169297 A1 | 7/2013 | Pilz |
| 2016/0116345 A1* | 4/2016 | Furtner .................... G01K 7/01 374/178 |

OTHER PUBLICATIONS

Y. Xiong, et al, "Prognostic and Warning System for Power-Electronic Modules in Electric, Hybrid Electric, and Fuel-Cell Vehicles," IEEE Trans. Industrial Electronics, vol. 55, Jun. 2008, pp. 2268-2276, Piscataway, New Jersey.

H. Oh, et al, "Physics-of-Failure, Condition Monitoring, and Prognostics of Insulated Gate Bipolar Transistor Modules: A Review," IEEE Trans. Power Electronics, vol. 30, May 2015, pp. 2413-2426, Piscataway, New Jersey.

N. Patil, "Identification of Failure Precursor Parameters for Insulated Gate Bipolar Transistors (IGBTs)," International Conference on Prognostics and Health Management, 2008, pp. 1-5, Denver, CO, USA.

Daniel Astigarraga, "Analysis of the Results of Accelerated Aging Tests in Insulated Gate Bipolar Transistors," IEEE Trans. Power Electronics, vol. 31, Nov. 2016, pp. 7953-7962, Piscataway, New Jersey.

S. Zhou, L. Zhou and P. Sun, "Monitoring Potential Defects in an IGBT Module Based on Dynamic Changes of the Gate Current," IEEE Trans. Power Electronics, vol. 28, Mar. 2013, pp. 1479-1487, Piscataway, New Jersey.

A. E. Ginart, "Online Ringing Characterization as a Diagnostic Technique for IGBTs in Power Drives," IEEE Trans. Instrumentation and Measurement, vol. 58, Jul. 2009, pp. 2290-2299, Piscataway, New Jersey.

T. Funaki, "A Study on Performance Degradation of SiC MOSFET for Burn-in Test of Body Diode," IEEE International Symposium on Power Electronics for Distributed Generation Systems (PEDG), Jul. 2013, pp. 1-5, Rogers, AR, USA.

* cited by examiner

SEMICONDUCTOR FAILURE PROGNOSTICATION

BACKGROUND

The present disclosure relates generally to failure prediction and health monitoring for semiconductor devices. Unanticipated failures in semiconductor devices cause system downtime in electrical systems such as utility grids and motor drives. While a semiconductor device may have an expected useable life, exposure to frequent thermal cycles or severe electrical stress will decrease the useable life of a semiconductor device. Device failure can be predicted by monitoring physical or electrical characteristics of a semiconductor, such as devices' ON-resistance ($R_{dson}$), gate leakage current ($I_{gss}$), drain-source leakage current ($L_{dss}$), and device's parasitic capacitances ($C_{oss}$, $C_{iss}$, $C_{rss}$). Many of these parameters can be quantified and monitored by measurements of variation in voltage and current. Existing semiconductor monitoring systems suffer from a number of shortcomings and disadvantages. There remain unmet needs including increased reliability, decreased sensor complexity, and reduced costs. For instance, some monitoring systems use high bandwidth circuitry to measure fast changing electrical variables such as switch transition times, gate threshold voltage, parasitic capacitances, and inductances. In addition, for SiC semiconductor devices, measurements of certain parameters, such as the $R_{dson}$, are unfit for predicting device failure given their dependence on device temperature. There is a significant need for the unique apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY

Exemplary embodiments include unique systems, methods, techniques and apparatuses for predicting semiconductor failure. Further embodiments, forms, objects, features, advantages, aspects and benefits of the disclosure shall become apparent from the following description and drawings.

DETAILED DESCRIPTION OF ILLUSTRATIVE EMBODIMENTS

Figure 1:
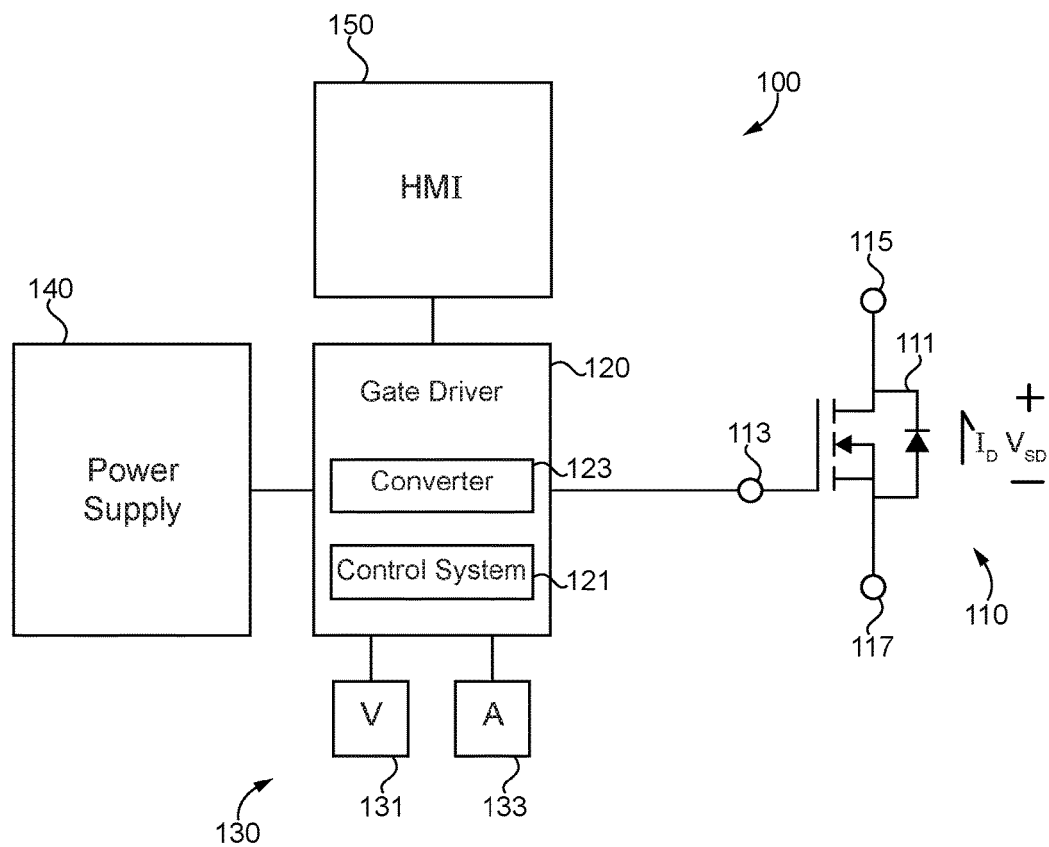
FIG. 1 is a diagram illustrating an exemplary semiconductor monitoring system.

With reference to FIG. 1 there is illustrated semiconductor monitoring system 100. It shall be appreciated that system 100 may be implemented in a variety of applications, including power converters used in power transmission networks and motor drives to name but a few examples.

System 100 includes a semiconductor device 110, a gate driver 120, a plurality of sensors 130, a power supply 140, and a human machine interface (HMI) 150. System 100 is structured to monitor the health of semiconductor device 110 by measuring steady state electrical characteristics of device 110. Monitoring the health of semiconductor device 110 may include predicting a near-term device failure by calculating the remaining useful life of the device.

Power supply 140 is structured to transmit electrical power to gate driver 120. Power supply may be a utility grid, energy storage device, generator, or any other type of power source structured to transmit alternating current power or direct current power.

The plurality of sensors 130 includes a voltage sensor 131 structured to measure voltage $V_{SD}$ between a source 115 and a drain 117 of semiconductor device 110. The plurality of sensors 130 also includes a current sensor 133 structured to measure current $I_D$ flowing through semiconductor device 110. In certain embodiments, device 110 is part of a converter and current sensor 133 is a phase leg current sensor structured to measure current flowing through a phase leg of the converter. Using measurements corresponding to the current of the phase-leg and PWM signals from gate driver 120, current $I_D$ is estimated.

In certain embodiments where device 110 is part of a converter including second or higher order harmonic filters and current sensor 133 measures current flowing through a phase leg of the converter, current sensor 133 is structured to compensate for switching frequency ripple. For example, current sensor 133 may be a high bandwidth sensor structured to measure current variations during switching frequency ripple, or current sensor 133 may be a low bandwidth sensor compensated to measure a closer representation of the instantaneous device 110 current.

In certain embodiments, voltage sensor 131 is a voltage transformer structured to step down voltage $V_{SD}$ and transmit the stepped down voltage to a control system 121 of gate driver 120 for measurement. In certain embodiments, current sensor 133 is a current transformer structured to step down current $I_D$ and transmit the stepped down current to control system 121 for measurement. In certain embodiments, sensors 131 and 133 are incorporated into gate driver 120.

HMI 150 is structured to output visual or audible indicators, such as alarms and warnings, to a user. For example, when gate driver 120 predicts a failure in device 110, HMI 150 displays a visual or audible indictor corresponding to predicting the failure of device 110. HMI 150 may be any device structured to actuate alarms or transmit warnings perceptible to a user, such as a display screen, a mobile device, or a control panel, to name but a few examples.

In certain embodiments, HMI 150 is remote from gate driver 120. For example, may be an interface which receives information from gate driver 120 by way of a communication network and a cloud-based computing device. In certain embodiments, a cloud-based computing device may receive measurements from control system 121 and use the measurements to monitor health status and predict device failure as described in more detail below.

In the illustrated embodiment, semiconductor device 110 is an n-channel silicon carbide (SiC) metal oxide field effect transistor (MOSFET) including an intrinsic body diode 111. SiC MOSFETs are fast switching devices structured to current to flow from source 115 to drain 117, known as forward conduction, and from drain 117 to source 115, known as reverse conduction. SiC MOSFETS may conduct current even when a channel is turned off. For example, intrinsic body diode 111 allows the SiC MOSFET to conduct in a reverse direction during dead time as opposed to relying on an external anti-parallel diode. In other embodiments, device 110 may be another type of MOSFET, a p-channel SiC MOSFET, or any other type of semiconductor device with an intrinsic body diode.

Device 110 is incorporated into an electrical system, such as a power converter, by way of a source 115 and a drain 117. A gate 113 of device 110 is structured to control the flow of current between source 115 and drain 117 in response to activation signals, such as PWM signals, received from gate driver 120.

Gate driver 120 is structured to operate and monitor device 110. Driver 120 includes a gate driver control system 121 and a power converter 123, such as a current amplifier or current buffer. Control system 121 is structured to transmit activation signals to converter 123 so as to receive power from power supply 140, convert the received power into activation signals, and transmit the activation signals to gate 113 of device 110. Power converter 123 may be any converter-like topology structured to generate positive voltage or negative voltage pulses.

Control system 121 is structured to receive measurements from the plurality of sensors 130 corresponding to voltage $V_{SD}$ and current $I_D$, and use the received measurements to monitor health status including predicting a failure of device 110 by calculating the remaining useful life of device 110. Control system 121 is structured to bring a near term device failure prediction to the attention of a user so that the user can replace the device before a failure occurs. Control system 121 is structured to use measurements from sensors 130 measured during steady state electrical conditions of device 110 which requires simpler circuitry compared to measuring device 110 characteristics during transition states 110. Control system 121 does not require a temperature sensor in order to predict device 110 failure.

Control system 121 may include a data structure, such as lookup tables, stored in memory which include possible resistance values at different temperatures, including channel resistance of device 110 during reverse conduction and expected body diode equivalent resistance. For example, control system 121 may include one lookup table including a plurality of channel resistances during reverse conduction, each resistance corresponding to a junction temperature such that control system 121 may determine a junction temperature of device 110 after determining a channel resistance during reverse conduction. In certain embodiments, channel resistance during reverse conduction is calculated using a voltage measurement and a current measurement. Control system 121 may also include another lookup table including a plurality of expected body diode equivalent resistances corresponding to a junction temperature such that control system 121 may determine an expected body diode equivalent resistance based on an estimated junction temperature and a determined body diode equivalent resistance. In certain embodiments, body diode equivalent resistance is determined by calculating the resistance using a voltage measurement and a current measurement.

In certain embodiments, control system 121 includes a plurality of devices structured to perform the functionality described with respect to control system 121. For example, control system 121 may include one controller associated with gate driver 121 structured to operate converter 123 and a second controller structured as an external device that receives signals from sensors 130, predicts a device 110 failure, and outputs an alert to HMI 150. In certain embodiments, control system 121 includes one controller located within gate driver 121 and a second controller located remotely, such as a cloud-based computing device.

Figure 2:
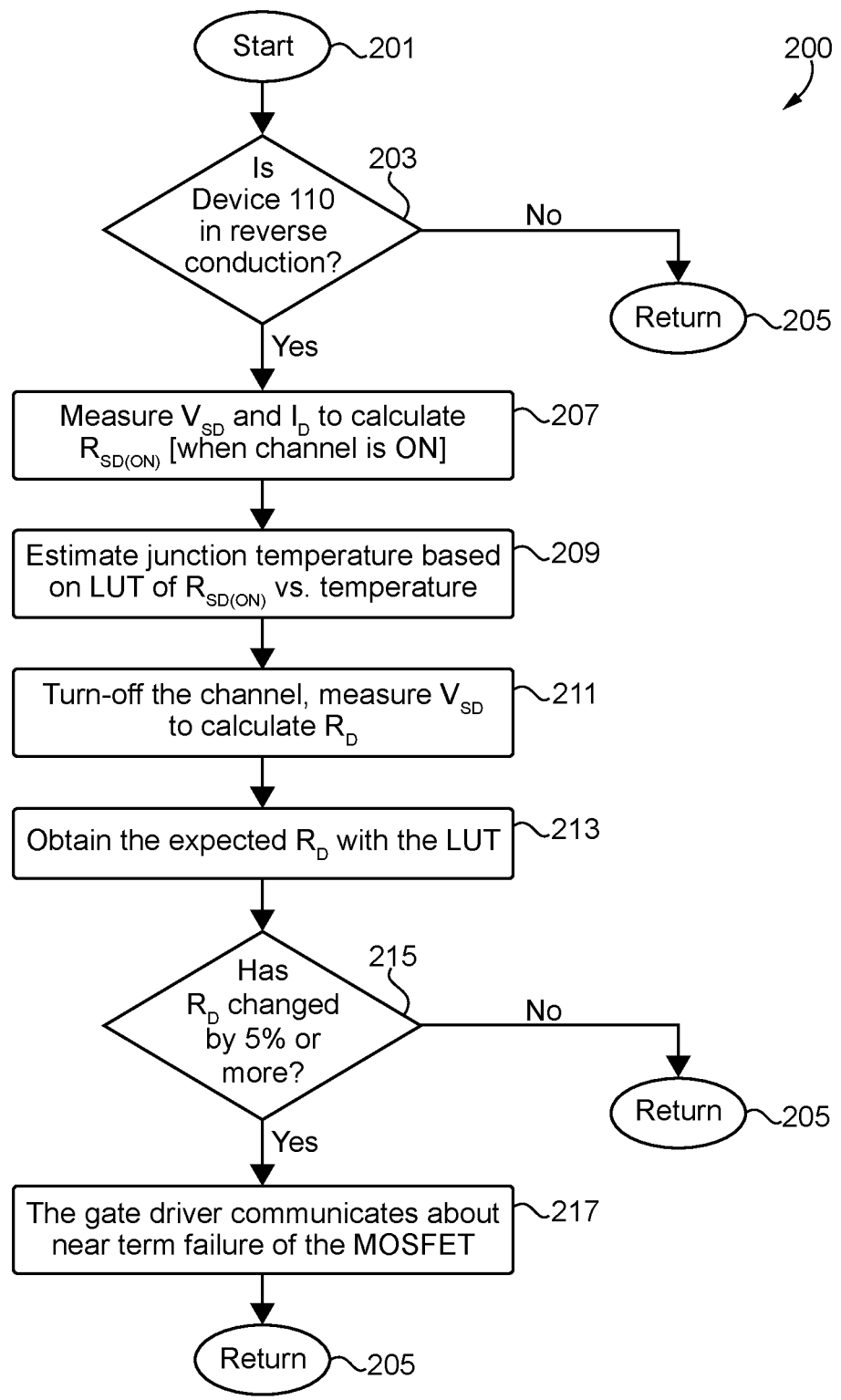
FIG. 2 is a flowchart illustrating an exemplary process for predicting a semiconductor failure.

With reference to FIG. 2, there is illustrated an exemplary process 200 for monitoring the health status and predicting device failure in a semiconductor device such as device 110 of system 100 in FIG. 1. Process 200 may be implemented in whole or in part in one or more of the control systems disclosed herein, such as control system 121 of system 100 in FIG. 1. In certain embodiments, converter 123 control and the failure prediction functionalities may be performed by separate controllers. In certain embodiments, control system 110 functionalities may be performed by the same controller. Furthermore, as noted above, control system 121 disclosed herein may be wholly or partially included in a gate driver or a cloud-based controller. Control system 121 may execute process 200 at a regular interval, such as hourly, daily, or weekly to name but a few examples.

Process 200 begins at start operation 201 and proceeds to conditional 203 where control system 121 determines whether device 110 is operating in a reverse conduction mode. If device 110 is not in reverse conduction mode, process 200 proceeds to end operation 205.

If device 110 is in reverse conduction mode, process 200 proceeds to operation 207 where voltage sensor 131 and current sensor 133 measure $V_{SD}$ and $I_D$, respectively, while the device 110 channel is on. Using the measurements from sensors 131 and 133, control system 121 determines the channel resistance, $R_{SD(ON)}$. In certain embodiments, multiple measurements of $V_{SD}$ and $I_D$ are used to determine channel resistance by averaging the results.

Process 200 proceeds to operation 209 where control system 121 estimates junction temperature of device 110 using the determined channel resistance $R_{SD(ON)}$. Control system 121 consults a lookup table stored in memory including channel resistance values during reverse conduction and corresponding temperature values. The estimated junction temperature is the temperature in the lookup table corresponding to the determined channel resistance. It should be noted that the error in temperature estimation due to the variation of $R_{SD(ON)}$ with aging may be ignored as it is insignificant compared to the change in $R_{SD(ON)}$ with temperature. In other embodiments, control system 121 may estimate junction temperature using determined channel resistance during forward conduction instead of determined channel resistance during reverse conduction.

Figure 3:
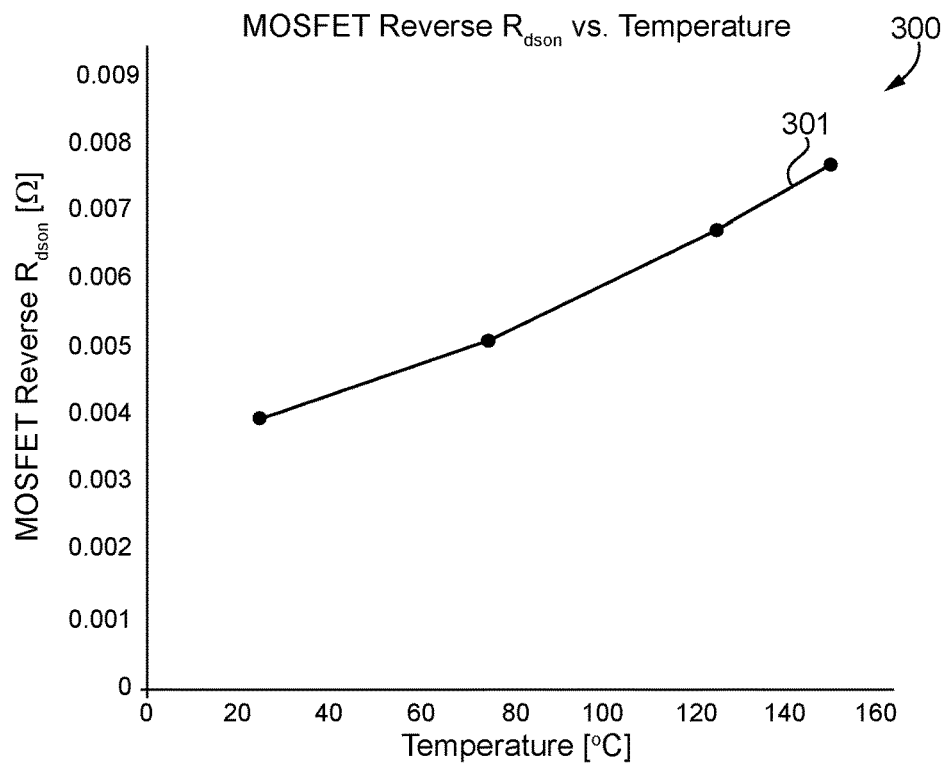
FIG. 3 is a graph illustrating exemplary semiconductor operational parameters.

With reference to FIG. 3, there is a graph 300 illustrating exemplary operational parameters of a semiconductor device, such as device 110 in FIG. 1. In the illustrated graph 300, device 110 is a SiC MOSFET with 1200 V and 500 A ratings in a non-co-pack module, which does not include an external diode. It shall be appreciated that graph 300 is offered for the purpose of illustration. Device 110 may be another semiconductor device with different operational parameters, voltage ratings and current ratings. Graph 300 includes line 301 illustrating the relationship of channel resistance $R_{SD(ON)}$ during reverse conduction and junction temperature. Rsd(ON) is increased by 94% as junction temperature increases from 25 C to 150 C.

With continuing reference to FIG. 2, Process 200 proceeds to operation 211 where control system 121 operates converter 123 so as to turn off the device 110 channel. Voltage sensor 131 then measures voltage $V_{SD}$. In certain embodiments, temperature and current $I_D$ remain nearly constant between the measurements of operation 207 and operation 211. In certain embodiments, control system 121 receives multiple $V_{SD}$ measurements while junction temperature and current $I_D$ are nearly constant, then average the $V_{SD}$ measurements before determining equivalent body diode resistance. Control system 121 then determines equivalent diode resistance $R_D$ using $V_{SD}$ measured in operation 211 and $I_D$ measured in 207.

In certain embodiments, voltage sensor 131 measures voltage $V_{SD}$ in operation 211 during dead time. In certain embodiments, control system 121 operates converter 123 so as to extend the body diode conduction period in order to reduce noise due to switching transitions and more accurately measure voltage and current, such as during a freewheeling period. For example, where device 110 is one of two switches device in a converter leg, gate driver control system 121 adjusts the length of one portion of the switching pattern where neither switches are on so as to reduce voltage ripple while the control system measures the second voltage. In certain embodiments, control system 121 operates converter 123 so as to turn off device 110 channel for one complete switching cycle during reverse conduction at a desired current.

Process 200 proceeds to operation 213 where control system 121 obtains an expected equivalent body diode resistance. To obtain the expected equivalent body diode resistance, control system 121 consults a lookup table including a plurality of junction temperatures each corresponding to an expected equivalent body diode resistance.

Process 200 proceeds to conditional 215 where resistance $R_D$ determined in operation 211 is compared to the expected body diode resistance obtained in operation 213. If the difference between both values is greater than a threshold, control system 121 predicts a failure will occur with sufficient warning to allow a user to replace the device before the predicted failure. For example, if the measured resistance $R_D$ differs from the expected body diode resistance by more than 5%, control system 121 will predict an imminent device failure. In certain embodiments, the threshold is greater than 5% or less than 5%. If the difference does not exceed the threshold value, process 200 proceeds to end operation 205.

If $R_D$ deviates from an expected value by more than a threshold value, process 200 proceeds to operation 217 where control system 121 alerts a user of a near term failure of device 110. For example, control system 121 may actuate an alarm or transmit a warning to an HMI so as to visually or audibly indicate the near term failure of device 110. Process 200 then proceeds to end operation 205.

It shall be further appreciated that a number of variations and modifications to process 200 are contemplated including, for example, the omission of one or more aspects of process 200, the addition of further conditionals and operations and/or the reorganization or separation of operations and conditionals into separate processes.

Figure 4:
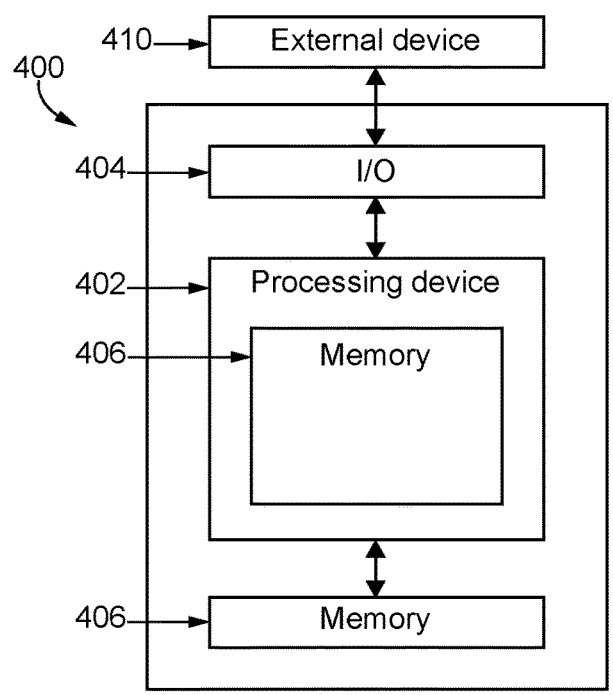
FIG. 4 is a schematic block diagram illustrating an exemplary controller.

With reference to FIG. 4, there is illustrated a schematic block diagram of a computing device 400. Computing device 400 is one example of a controller which is used, in different embodiments, in connection with an exemplary semiconductor monitoring system, such as system 100 shown in FIG. 1. Computing device 400 includes a processing device 402, an input/output device 404, and a memory device 406. Computing device 400 may be a stand-alone device, an embedded system, or a plurality of devices structured to perform the functions described with respect to control system 121. Furthermore, computing device 400 communicates with one or more external devices 410.

Input/output device 404 enables the computing device 400 to communicate with external device 410. For example, input/output device 404 in different embodiments may be a network adapter, network credential, interface, or a port (e.g., a USB port, serial port, parallel port, an analog port, a digital port, VGA, DVI, HDMI, FireWire, CAT 5, Ethernet, fiber, or any other type of port or interface), to name but a few examples. Input/output device 404 is comprised of hardware, software, and/or firmware. It is contemplated that input/output device 404 includes more than one of these adapters, credentials, or ports, such as a first port for receiving data and a second port for transmitting data.

External device 410, such as HMI 150 or sensors 130, in different embodiments is any type of device that allows data to be input or output from computing device 400. For example, external device 410 in different embodiments is a sensor, as a mobile device, a reader device, equipment, a handheld computer, a diagnostic tool, a controller, a computer, a server, a printer, a display, a visual indicator, a keyboard, a mouse, or a touch screen display. Furthermore, it is contemplated that external device 410 is be integrated into computing device 400. It is further contemplated that more than one external device is in communication with computing device 400.

Processing device 402 in different embodiments is a programmable type, a dedicated, hardwired state machine, or a combination of these. Device 402 can further include multiple processors, Arithmetic-Logic Units (ALUs), Central Processing Units (CPUs), Digital Signal Processors (DSPs), Field-programmable Gate Array (FPGA), to name but a few examples. For forms of processing device 402 with multiple processing units, distributed, pipelined, or parallel processing can be used as appropriate. Processing device 402 may be dedicated to performance of just the operations described herein or may be utilized in one or more additional applications. In the illustrated form, processing device 402 is of a programmable variety that executes processes and processes data in accordance with programming instructions (such as software or firmware) stored in memory device 406. Alternatively or additionally, programming instructions are at least partially defined by hardwired logic or other hardware. Processing device 402 can be comprised of one or more components of any type suitable to process the signals received from input/output device 404 or elsewhere, and provide desired output signals. Such components may include digital circuitry, analog circuitry, or a combination of both.

Memory device 406 in different embodiments is of one or more types, such as a solid-state variety, electromagnetic variety, optical variety, or a combination of these forms, to name but a few examples. Furthermore, memory device 406 can be volatile, nonvolatile, transitory, non-transitory or a combination of these types, and some or all of memory device 406 can be of a portable variety, such as a disk, tape, memory stick, cartridge, to name but a few examples. In addition, memory device 406 can store data that is manipulated by processing device 402, such as data representative of signals received from or sent to input/output device 404 in addition to or in lieu of storing programming instructions, just to name one example. As shown in FIG. 4, memory device 406 may be included with processing device 402 or coupled to processing device 402, but need not be included with both.

Further written description of a number of exemplary embodiments shall now be provided. One embodiment is a power converter comprising a semiconductor switch structured to allow electric current to flow in forward conduction from a source to a drain in a channel while the switch is turned on, in reverse conduction from a drain to a source in the channel while the switch is turned on, and in reverse conduction from the drain to the source by way of an intrinsic body diode while the switch is turned off; a converter control system including a processing device and a non-transitory computer readable medium structured to store instructions executable by the processing device to turn on the semiconductor switch, measure a first voltage of the semiconductor switch and a current of the semiconductor switch during reverse conduction, estimate a junction temperature of the semiconductor device using the first voltage measurement and the current measurement, turn off the semiconductor device, measure a second voltage of the semiconductor device after turning off the semiconductor device, determine a resistance value using the second voltage measurement, determine an expected resistance value using the junction temperature and the second voltage measurement, predict a failure of the semiconductor device using the resistance value and the expected resistance value, and actuate an alarm or transmit a warning in response to predicting the failure of the semiconductor device.

In certain forms of the foregoing converter, the converter control system is structured to turn on the semiconductor switch by transmitting an activation signal to a gate of the semiconductor switch, the activation signal being configured to control the semiconductor switch so as to allow forward conduction or reverse conduction. In certain forms, the semiconductor device is a SiC MOSFET. In certain forms, the resistance value is body diode equivalent resistance. In certain forms, the control system includes a phase leg current sensor and wherein measuring the current of the semiconductor switch includes measuring the phase leg current and determining the current flowing through the semiconductor switch using the measured phase leg current. In certain forms, the first voltage measurement corresponds to the voltage across the channel, the current measurement corresponds to the current through the channel, and the second voltage corresponds to the voltage across the body diode. In certain forms, the converter control system includes a local controller incorporated into a gate driver and a remote cloud-based controller coupled to the local controller and structured to receive information from the local controller corresponding to the failure prediction and actuate the alarm in response to receiving the information from the local controller.

Another exemplary embodiment is a semiconductor device monitoring system for a semiconductor device including an intrinsic body diode, the system comprising a gate driver comprising a processing device, and a non-transitory computer readable medium structured to store instructions that when executed by the processing device are configured to receive a first set electrical characteristics of the semiconductor switch during a conduction condition, determine a first resistance value using the first set of electrical characteristics, determine a junction temperature using the first resistance value, receive a second set of electrical characteristics of the semiconductor switch during a body diode conduction condition, determine a second resistance value of the body diode using the second set of electrical characteristics, determine a device health status using the second resistance value and the determined junction temperature, and output a device health status to a human machine interface.

In certain forms of the foregoing system, the semiconductor device is a SiC MOSFET. In certain forms, the first set of electrical characteristics contains a first voltage between a drain and a source of the semiconductor device and current flowing through the semiconductor device during reverse conduction, and the second set of electrical characteristics includes a second voltage across the body diode. In certain forms, determining the temperature includes consulting a lookup table including a set of junction temperature values corresponding to a set of possible first resistance values. In certain forms, determining a device health status using the second resistance value includes consulting a lookup table including a set of junction temperature values corresponding to a set of possible second resistance values. In certain forms, the first set of electrical characteristics and the second set of electrical characteristics received by the gate driver correspond to a time during which the current flowing through the semiconductor switch is less than 1% different compared to the magnitude of the current during the measurement of the second set of electrical characteristics. In certain forms, the first set of electrical characteristics contains a first voltage between a drain and a source of the semiconductor device and current flowing through the semiconductor device during forward conduction.

A further exemplary embodiment is a method for predicting a failure in a semiconductor device including an intrinsic body diode, the method comprising: operating a gate driver so as to turn on the semiconductor device; receiving a first voltage measurement of the semiconductor device channel during a reverse conduction event; receiving a current measurement of the semiconductor device channel during the reverse conduction event; estimating a junction temperature of the semiconductor device using the first voltage measurement and the current measurement; operating the gate driver so as to turn off the semiconductor device; receiving a second voltage measurement of the body diode after turning off the semiconductor device; determining a resistance value using the second voltage measurement; determining an expected resistance value using the junction temperature and the second voltage measurement; predicting a failure of the semiconductor device using the resistance value and the expected resistance value; and transmitting a semiconductor device failure indicator.

In certain forms of the foregoing method, estimating the junction temperature includes calculating a reverse conduction resistance value using the first voltage measurement and the current measurement. In certain forms, estimating the junction temperature includes consulting a lookup table including a set of junction temperature values corresponding to reverse conduction resistance values. In certain forms, transmitting a semiconductor device failure indicator includes transmitting the indicator to a human machine interface by way of a cloud-based computing device. In certain forms, predicting a failure of the semiconductor device includes determining a difference between the resistance value and the expected resistance value exceeds a failure threshold. In certain forms, the failure threshold is greater than or equal to 5% of the expected resistance value.

It is contemplated that the various aspects, features, processes, and operations from the various embodiments may be used in any of the other embodiments unless expressly stated to the contrary. Certain operations illustrated may be implemented by a computer executing a computer program product on a non-transient computer readable storage medium, where the computer program product includes instructions causing the computer to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described and that all changes and modifications that come within the spirit of the present disclosure are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with or a connection to another item as well as a belonging to or a connection with the other item as informed by the context in which it is used. The terms "coupled to," "coupled with" and the like include indirect connection and coupling and further include but do not require a direct coupling or connection unless expressly indicated to the contrary. When the language "at least a portion" and/or "a portion" is used the item can include a portion and/or the entire item unless specifically stated to the contrary.

What is claimed is:

1. A power converter comprising:
a semiconductor switch structured to allow electric current to flow in forward conduction from a source to a drain in a channel while the switch is turned on, in reverse conduction from the drain to the source in the channel while the switch is turned on, and in reverse conduction from the drain to the source by way of an intrinsic body diode while the switch is turned off;
a converter control system including a processing device and a non-transitory computer readable medium structured to store instructions executable by the processing device to:
turn on the semiconductor switch,
measure a first voltage of the semiconductor switch and a current of the semiconductor switch during reverse conduction,
estimate a junction temperature of the semiconductor switch using the first voltage measurement and the current measurement,
turn off the semiconductor switch,
measure a second voltage of the semiconductor switch after turning off the semiconductor switch,
determine a resistance value using the second voltage measurement,
determine an expected resistance value using the junction temperature and the second voltage measurement,
predict a failure of the semiconductor switch using the resistance value and the expected resistance value, and
actuate an alarm or transmit a warning in response to predicting the failure of the semiconductor switch.

2. The power converter of claim 1 wherein the converter control system is structured to turn on the semiconductor switch by transmitting an activation signal to a gate of the semiconductor switch, the activation signal being configured to control the semiconductor switch so as to allow forward conduction or reverse conduction.

3. The power converter of claim 1 wherein the semiconductor switch is a SiC MOSFET.

4. The power converter of claim 1 wherein the resistance value is body diode equivalent resistance.

5. The power converter of claim 1 wherein the converter control system includes a phase leg current sensor and wherein measuring the current of the semiconductor switch includes measuring the phase leg current and determining the current flowing through the semiconductor switch using the measured phase leg current.

6. The power converter of claim 1 wherein the first voltage measurement corresponds to the voltage across the channel, the current measurement corresponds to the current through the channel, and the second voltage corresponds to the voltage across the body diode.

7. The power converter of claim 6 wherein the converter control system includes a local controller incorporated into a gate driver and a remote cloud-based controller coupled to the local controller and structured to receive information from the local controller corresponding to the failure prediction and actuate the alarm in response to receiving the information from the local controller.

8. A semiconductor device monitoring system for a semiconductor device including an intrinsic body diode, the system comprising:
a gate driver comprising:
a processing device, and a non-transitory computer readable medium structured to store instructions that when executed by the processing device are configured to:
receive a first set of electrical characteristics of the semiconductor device during a conduction condition,
determine a first resistance value using the first set of electrical characteristics,
determine a junction temperature using the first resistance value,
receive a second set of electrical characteristics of the semiconductor device during a body diode conduction condition,
determine a second resistance value of the body diode using the second set of electrical characteristics,
determine a device health status using the second resistance value and the determined junction temperature, and
output a device health status to a human machine interface.

9. The system of claim 8 wherein the semiconductor device is a SiC MOSFET.

10. The system of claim 8 wherein the first set of electrical characteristics contains a first voltage between a drain and a source of the semiconductor device and current flowing through the semiconductor device during reverse conduction, and the second set of electrical characteristics includes a second voltage across the body diode.

11. The system of claim 8 wherein determining the junction temperature includes consulting a lookup table including a set of junction temperature values corresponding to a set of possible first resistance values.

12. The system of claim 8 wherein determining the device health status using the second resistance value includes consulting a lookup table including a set of junction temperature values corresponding to a set of possible second resistance values.

13. The system of claim 8 wherein the first set of electrical characteristics and the second set of electrical characteristics received by the gate driver correspond to a time during which the current flowing through the semiconductor device is less than 1% different compared to the magnitude of the current during the measurement of the second set of electrical characteristics.

14. The system of claim 8 wherein the first set of electrical characteristics contains a first voltage between a drain and a source of the semiconductor device and current flowing through the semiconductor device during forward conduction.

15. A method for predicting a failure in a semiconductor device including an intrinsic body diode, the method comprising:
   operating a gate driver so as to turn on the semiconductor device;
   receiving a first voltage measurement of the semiconductor device channel during a reverse conduction event;
   receiving a current measurement of the semiconductor device channel during the reverse conduction event;
   estimating a junction temperature of the semiconductor device using the first voltage measurement and the current measurement;
   operating the gate driver so as to turn off the semiconductor device;
   receiving a second voltage measurement of the body diode after turning off the semiconductor device;
   determining a resistance value using the second voltage measurement;
   determining an expected resistance value using the junction temperature and the second voltage measurement;
   predicting a failure of the semiconductor device using the resistance value and the expected resistance value; and
   transmitting a semiconductor device failure indicator.

16. The method of claim 15 wherein estimating the junction temperature includes calculating a reverse conduction resistance value using the first voltage measurement and the current measurement.

17. The method of claim 16 wherein estimating the junction temperature includes consulting a lookup table including a set of junction temperature values corresponding to reverse conduction resistance values.

18. The method of claim 15 wherein transmitting the semiconductor device failure indicator includes transmitting the indicator to a human machine interface by way of a cloud-based computing device.

19. The method of claim 15 wherein predicting the failure of the semiconductor device includes determining a difference between the resistance value and the expected resistance value exceeds a failure threshold.

20. The method of claim 15 wherein the failure threshold is greater than or equal to 5% of the expected resistance value.

* * * * *